United States Patent
Shibata et al.

(10) Patent No.: US 6,958,638 B2
(45) Date of Patent: Oct. 25, 2005

(54) SLEW RATE CONTROLLING METHOD AND SYSTEM FOR OUTPUT DATA

(75) Inventors: Tomoyuki Shibata, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/681,836

(22) Filed: Oct. 9, 2003

(65) Prior Publication Data

US 2004/0105317 A1 Jun. 3, 2004

(30) Foreign Application Priority Data

Oct. 10, 2002 (JP) ........................................ 2002-298009

(51) Int. Cl.$^7$ .............................................. H03K 3/017
(52) U.S. Cl. ...................................................... 327/170
(58) Field of Search ................................ 327/108, 112, 327/131, 134–136, 170–176; 326/82–87, 56–58, 36

(56) References Cited

U.S. PATENT DOCUMENTS

| 6,288,563 B1 | * | 9/2001 | Muljono et al. | ............... | 326/27 |
| 6,300,788 B1 | * | 10/2001 | Sher et al. | .................... | 326/21 |
| 6,836,168 B1 | * | 12/2004 | Lesea et al. | ................. | 327/170 |

FOREIGN PATENT DOCUMENTS

| JP | 05-191241 | 7/1993 |
| JP | 06164360 | 6/1994 |
| JP | 06-296129 | 10/1994 |
| JP | 09-93116 | 4/1997 |

* cited by examiner

Primary Examiner—My-Trang Nu Ton
(74) Attorney, Agent, or Firm—McGinn & Gibb, PLLC

(57) ABSTRACT

A slew rate controlling system for output data is provided which is capable of improving an output data window even when change in a potential difference between a first power supply (VDD) to be used for outputting and a second power supply (VDDQ) to be used internally occurs. The slew rate controlling system is achieved by using a VDD-VDDQ potential difference detecting circuit to detect a decrease in a potential difference between the first power supply (VDD) and the second power supply (VDDQ) and to produce a first signal with specified timing and to detect an increase in a potential difference between the first power supply (VDD) and the second power supply (VDDQ) and to produce a second signal and by using a slew rate controlling circuit to exert control, when the first signal is significant, to enlarge a transition speed in a fall of output data and to exert control, when the second signal is significant, to enlarge the transition speed in a rise of output data and to produce output data.

19 Claims, 7 Drawing Sheets

FIG.1A

1; VDD - VDDQ potential difference detecting circuit

FIG.1B

2; slew rate controlling circuit
3; driver circuit
4; output buffer circuit

SLEW RATE CONTROLLING METHOD AND SYSTEM FOR OUTPUT DATA

BACKGROUND OF THE INVENTION

1. Field of the Invention

The present invention relates to a slew rate controlling method and system for output data, and more particularly to the slew rate controlling method and system for output data to be performed based on a result from comparison of a potential difference between two power supplies, one being a power supply (VDDQ) to be used for outputting in an output buffer and another being a power supply (VDD) to be used internally in circuits placed in a front stage in an SDRAM (Synchronous Dynamic Random Access Memory) or a like.

The present application claims priority of Japanese Patent Application No. 2002-298009 filed on Oct. 10, 2002, which is hereby incorporated by reference.

2. Description of the Related Art

In order for data being output from an output buffer such as an SDRAM or a like to be correctly recognized by a receiving part, it is necessary that a noise margin is high and that a proportion of a period (valid period) of holding significant data is large and as a concept to show this degree, a data window is used. Also, in order for a valid period to become longer, it is necessary that output data has a balance between its high and low levels and that a slope of a transition portion is large. Generally, when skew between a data strobe signal (DQS) and a data output (DQ) is smaller, the data window becomes the better.

Controlling of a slew rate of data to lengthen a valid period of output data is effective in improving a data window. Conventionally, such controlling of a slew rate of data, in general, is performed in a predetermined fixed manner and in accordance with external setting. (Though a survey on a prior art is carried out in ordinary effort ranges, no information about a reference concretely describing contents of the related art described above was obtained).

However, a valid period of output data varies due to factors related to other devices such as change in a power-supply voltage. For example, if a change occurs in a potential difference between the power supply (VDDQ) to be used for outputting to supply power to an output buffer which produces output data and the power supply (VDD) to be used internally to supply power to circuits placed in a front stage of the output buffer, a valid period of output data becomes short.

That is, there is a problem that, in a device having two types of power supplies in including the power supply to be used for outputting and the power supply to be used internally, or two or more types power supplies, when a potential difference being different from an initial potential difference occurs between the power supply to be used for outputting and the power supply to be used internally due to intrinsic or extrinsic factors during operations, the data window of an output is worsened due to no slew rate control (or speed control) based on proper setting in a state where the potential difference has occurred.

SUMMARY OF THE INVENTION

In view of the above, it is an object of the present invention to provide a slew rate controlling method and system for output data which is capable of detecting potential differences among a plurality of power supplies during operations in a device having two or more types of power supplies and of exerting an optimum slew rate control based on a result of the detection of the potential difference to improve a data window which enables high-speed data transfer.

According to a first aspect of the present invention, there is provided a slew rate controlling method for output data including:

a step of sampling a potential difference among two or more power supplies with specified timing to generate signals each indicating a tendency in a change in the potential difference and of changing a transition speed occurring at time of a rise or fall of output data based on the signals each indicating a tendency in a change in the potential difference.

According to a second aspect of the present invention, there is provided a slew rate controlling method for output data including:

a potential difference detecting circuit to detect a decrease in a potential difference among a first power supply and a second power supply to produce a first signal with specified timing and to detect an increase in a potential difference between the first power supply and the second power supply to produce a second signal with specified timing; and a slew rate controlling circuit to exert, when the first signal is significant, control so as to enlarge a transition speed occurring at time of a fall of output data and, when the second signal is significant, so as to enlarge a transition speed occurring at time of a rise of output data to produce output data.

In the foregoing second aspect, a preferable mode is one wherein the potential difference detecting circuit includes a first differential amplification circuit to produce an output when a potential difference between the first power supply and the second power supply becomes a preset value or less, a first sampling circuit to latch an output from the first differential amplification circuit with specified timing and to produce the first signal, a second differential amplification circuit to produce an output when a potential difference between the first power supply and the second power supply becomes the preset value or more, and a second sampling circuit to latch an output from the second differential amplification circuit and to produce the second signal.

Another preferable mode is one wherein, in the potential difference detecting circuit, specified timing with which the first or second signal is produced is timing with which an external command is received.

Still another preferable mode is one wherein the external command is at least one of a writing command and a reading command in a memory device, an active command to provide an instruction for initiating operations of row systems, an MRS (Mode Register Set) command to provide an instruction for setting of an operating mode set register, and an EMRS (Extended Mode Register Set) command to provide an instruction for setting of an extended operating mode set register.

An additional preferable mode is one, in the potential difference detecting circuit, specified timing with which the first or second signal is produced is timing that is set at an another register when the MRS command to provide an instruction for setting of an operating mode set register or the EMRS command to provide an instruction for setting of an extended operating mode set register is received.

A further preferable mode is one wherein the slew rate controlling circuit includes a driver circuit to exert, when the first signal is significant, control on the first and second input data so as to enlarge a transition speed occurring at time of a fall of output data and, when the second signal is significant, so as to enlarge a transition speed occurring at time of a rise of output data and to produce first and second output data and an output buffer circuit to produce a high-level output when both the first and second output data are at a low level and to produce a low-level output when both the first and second output data are at a high level.

A still further preferable mode is one wherein the slew rate controlling circuit includes a logically-operated circuit having a first logical device to propagate and output a data signal to be output at time of a rise of an external clock when an output buffer is in an enable state and, when the output buffer is in a disenable state, its output is at a high level all the time, a second logical device to propagate and output a data signal to be output at time of a fall of an external clock when an output buffer is in an enable state and, when the output buffer is in a disenable state, its output is at a high level all the time, a third logical device to propagate and output a data signal to be output at time of a rise of an external clock when an output buffer is in an enable state and, when the output buffer is in a disenable state, its output is at a low level all the time, and a fourth logical device to propagate and output a data signal to be output at time of a fall of an external clock when an output buffer is in an enable state and, when the output buffer is in a disenable state, its output is at a low level all the time and a selector circuit to select an output out of an output from the first logical device and an output from the second logical device in response to a complementary clock signal to be used for outputting and to produce the first input data and to select an output out of an output from the third logical device and an output from the fourth logical device in response to a complementary clock signal to be used for outputting and to produce the second input data.

With the above configurations, since the slew rate controlling is achieved by incorporating a potential difference detecting circuit in a portion where the slew rate controlling is performed in an output buffer of an SDRAM or a like and by using results from comparison of a potential difference between the second power supply VDDQ to be used for outputting and the first power supply VDD to be used internally, even under a worst condition including a combination of minimum/maximum values of each of the first power supply VDD and the second power supply VDDQ, an output window is improved and stable high-speed data transfer is made possible.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1A:
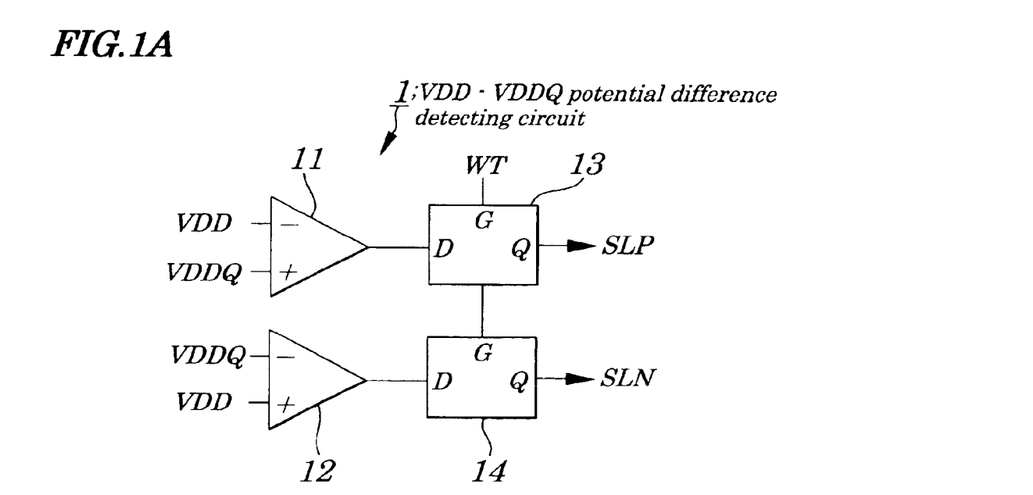
FIGS. 1A and 1B are block diagrams showing basic configurations of circuits to perform a slew rate controlling method for output data according to a first embodiment of the present invention.
Figure 1B:
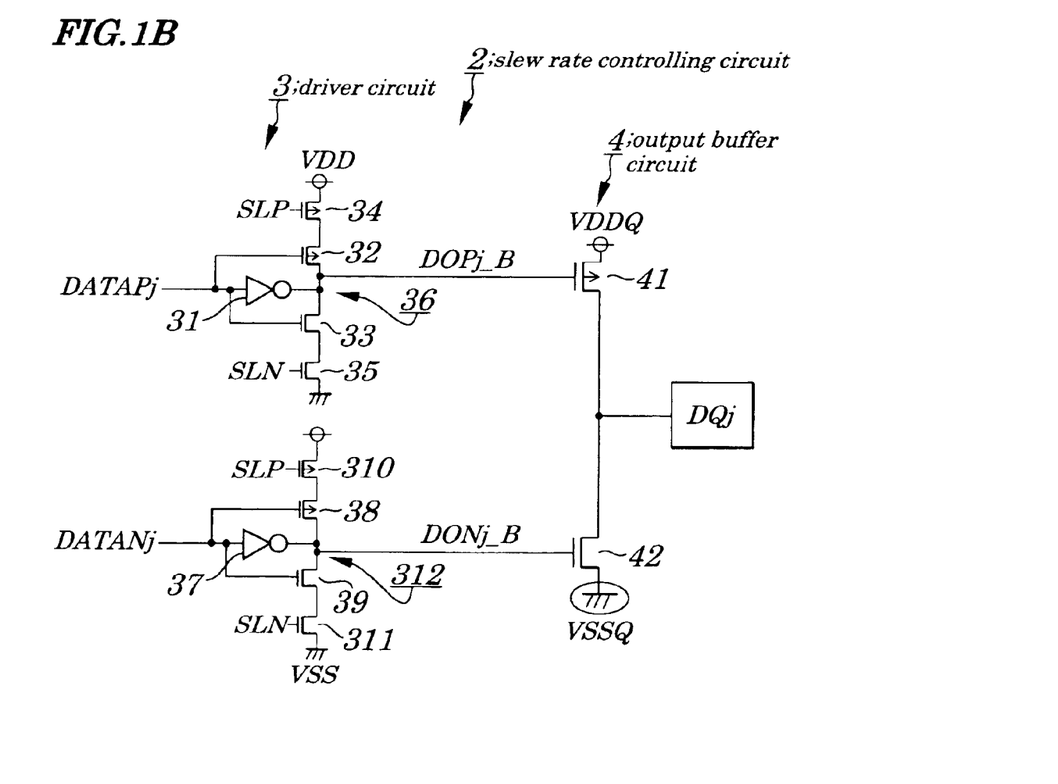
Figure 2:
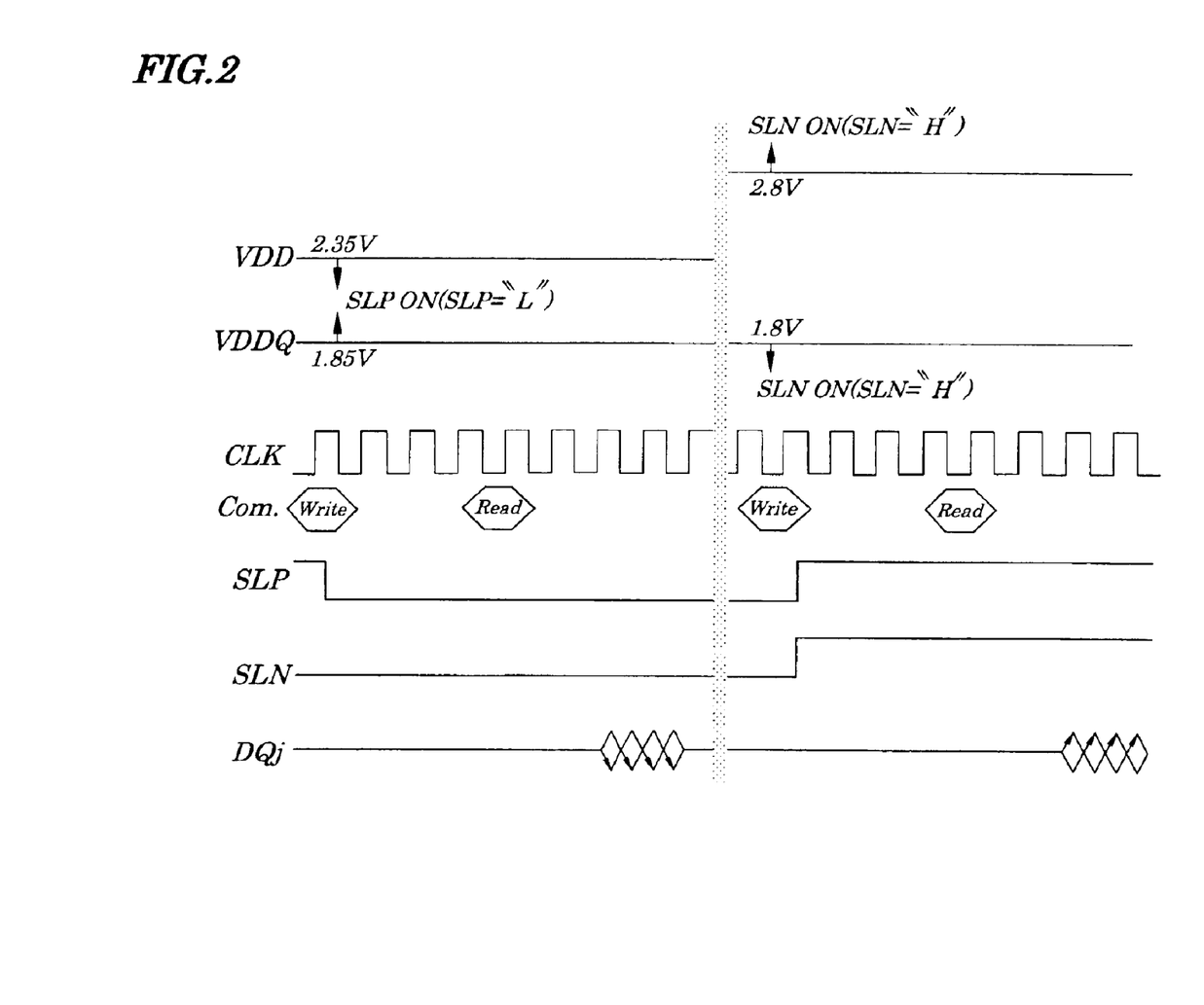
FIG. 2 is a diagram explaining operations to be performed by the slew rate controlling method for output data according to the first embodiment of the present invention.
Figure 3:
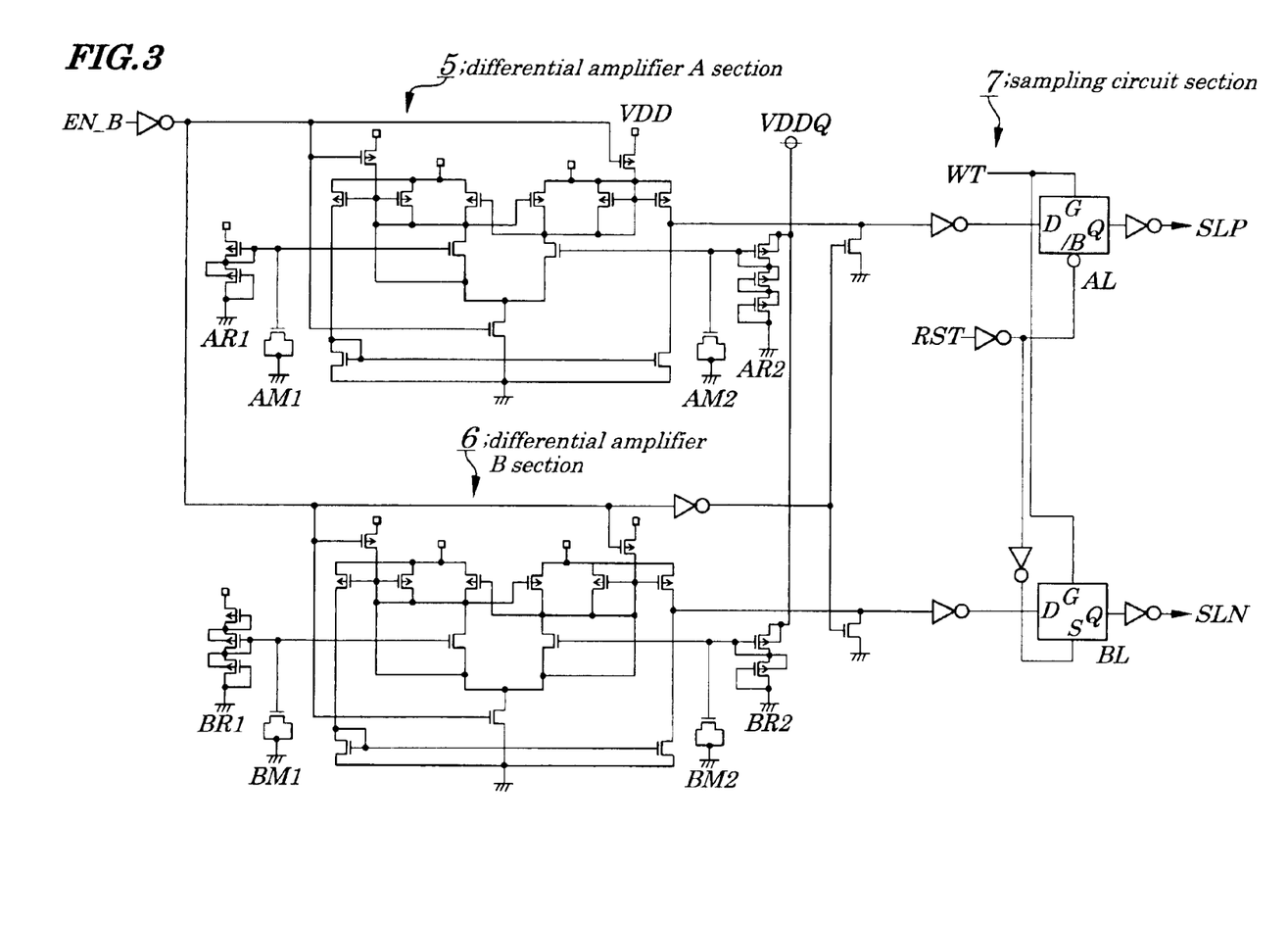
FIG. 3 is a diagram showing concrete configurations of a VDD-VDDQ potential difference detecting circuit according to the first embodiment of the present invention.
Figure 4:
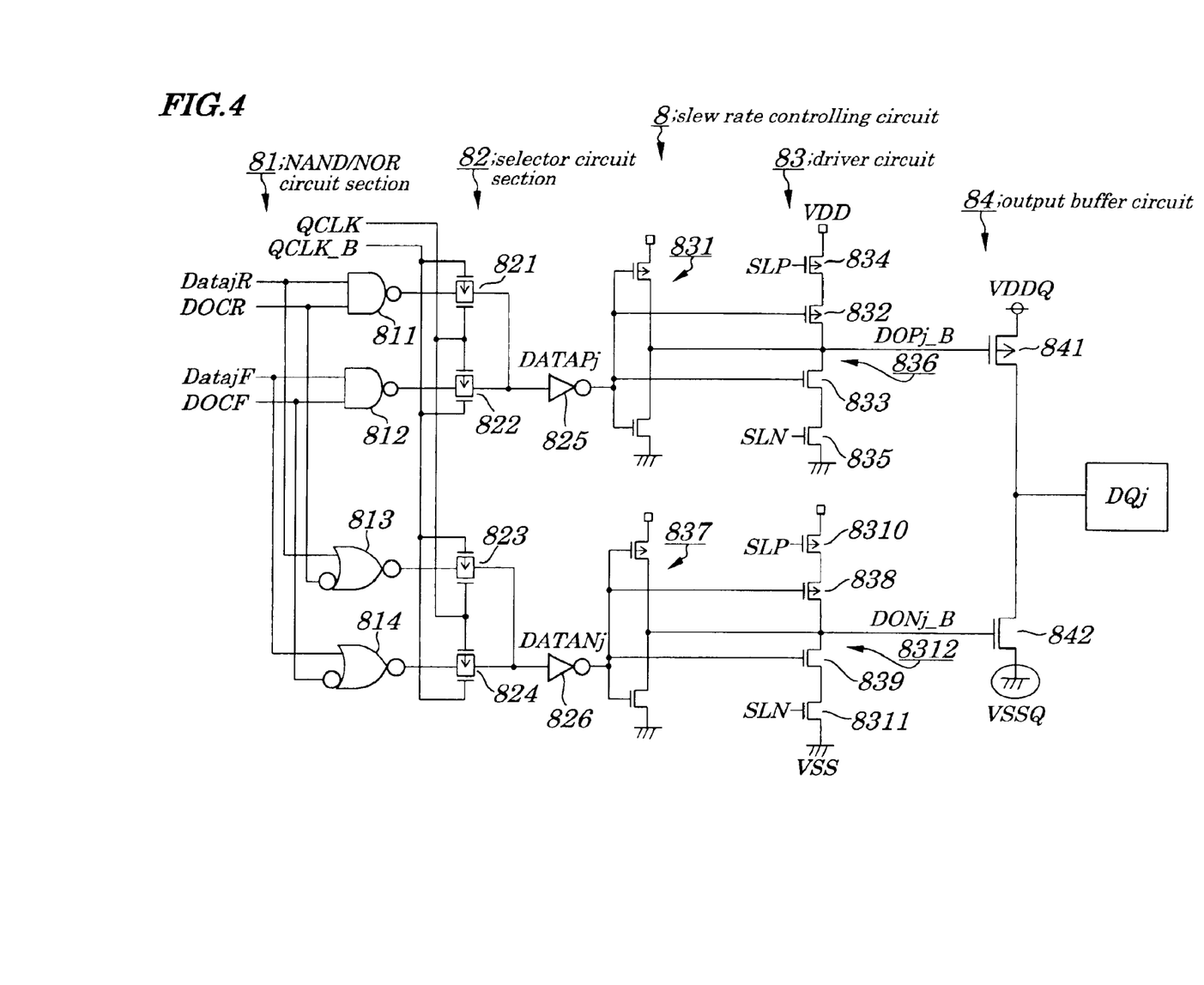
FIG. 4 is a diagram showing concrete configurations of a slew rate controlling circuit and an output buffer circuit to be used when the slew rate controlling method of the first embodiment is applied to achieve control on output data of a DDR (Double Data Rate) SDRAM.
Figure 5:
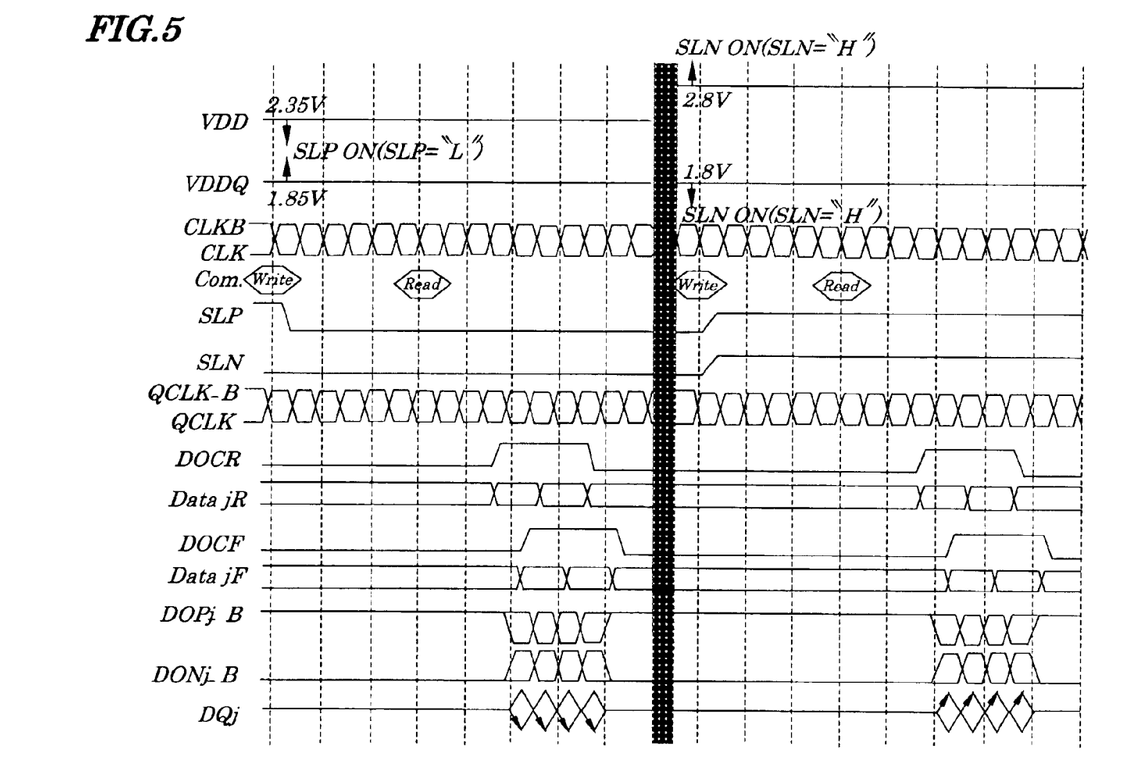
FIG. 5 is a diagram explaining operations to be performed by the slew rate controlling method for output data using circuit configurations shown in FIG. 4.
Figure 6:
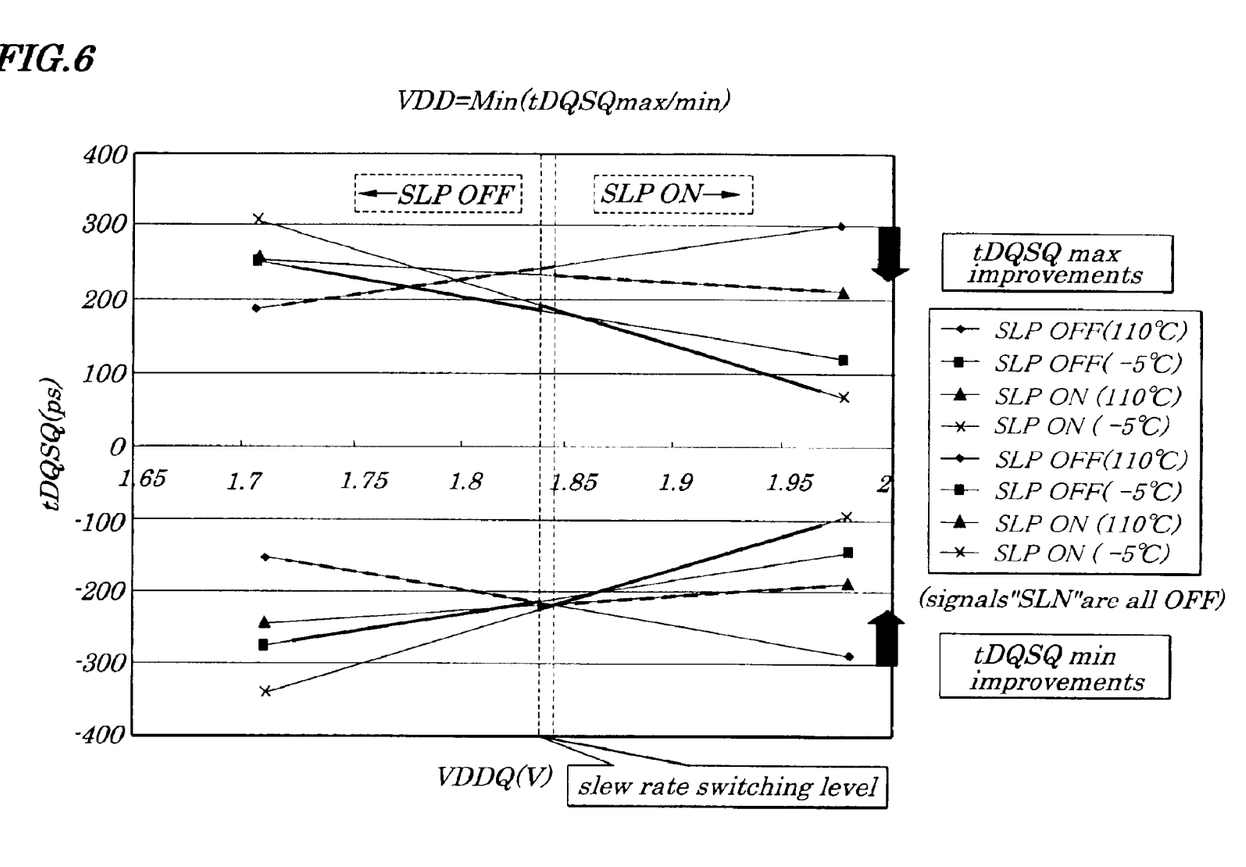
FIG. 6 is a diagram showing improvements of a tDQSQ value (Alternate-Current characteristic value used to represent a degree of improvements in an output data window) occurring when the VDD is minimum, which is achieved by the slew rate controlling method for output data of the first embodiment of the present invention.
Figure 7:
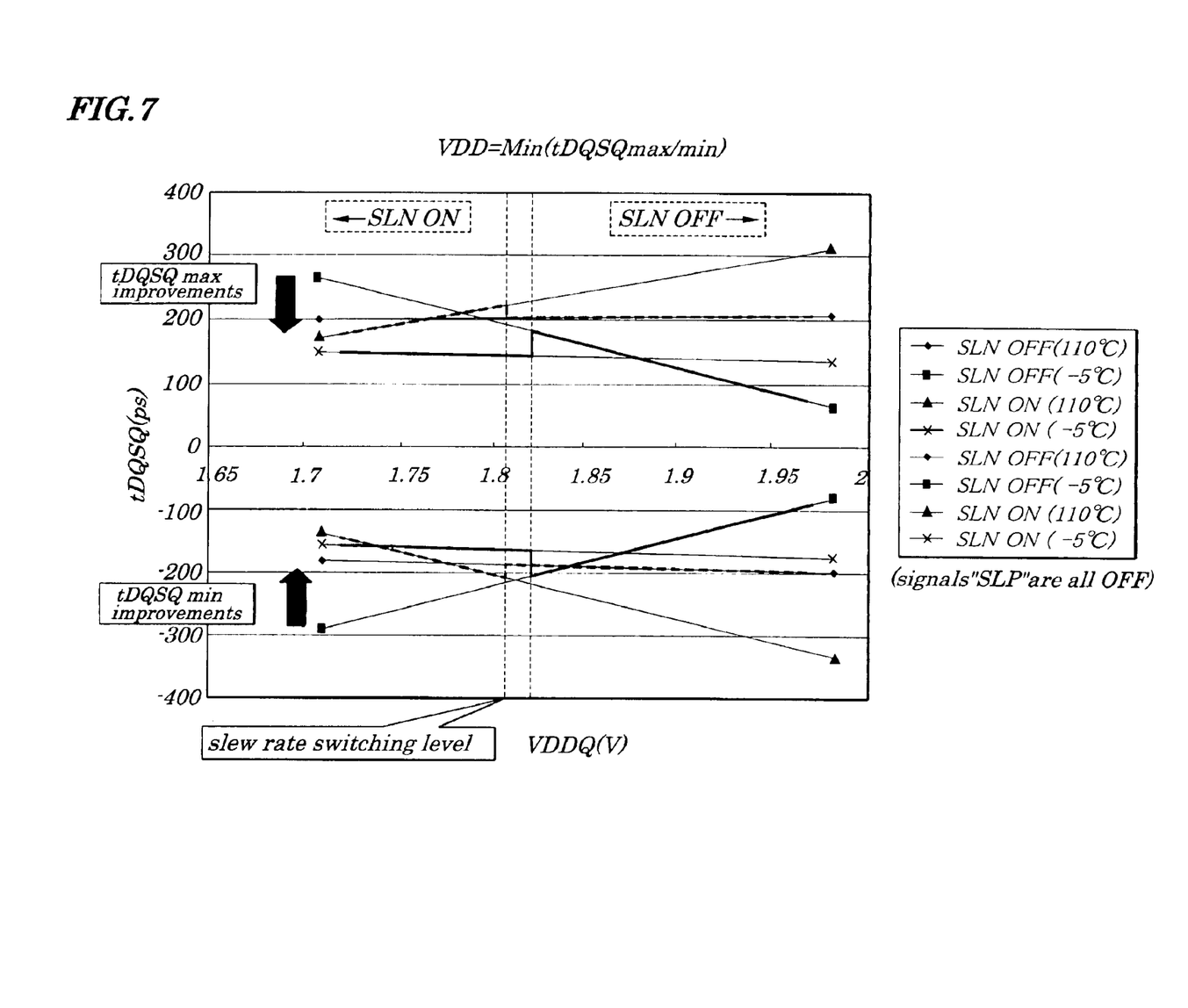
FIG. 7 is a diagram showing improvements of the tDQSQ value occurring when the VDD is maximum, which is achieved by the slew rate controlling method for output data of the first embodiment of the present invention.

FIGS. 1A and 1B are block diagrams showing basic configurations of circuits to perform a slew rate controlling method for output data according to a first embodiment of the present invention. FIG. 2 is a diagram explaining operations to be performed by the slew rate controlling method for output data according to the first embodiment. FIG. 3 is a diagram showing concrete configurations of a VDD-VDDQ potential difference detecting circuit according to the first embodiment. FIG. 4 is a diagram showing concrete configurations of a slew rate controlling circuit and an output buffer circuit to be used when the slew rate controlling method of the first embodiment is applied to achieve control on output data of a DDR (Double Data Rate) SDRAM. FIG. 5 is a diagram explaining operations to be performed by the slew rate controlling method for output data using circuit configurations shown in FIG. 4. FIG. 6 is a diagram showing improvements of a tDQSQ value (Alternate-Current characteristic value used to represent a degree of improvements in an output data window) occurring when the VDD is minimum, which is achieved by the slew rate controlling method for output data of the first embodiment. FIG. 7 is a diagram showing improvements of the tDQSQ value occurring when the VDD is maximum, which is achieved by the slew rate controlling method for output data of the first embodiment.

Basic Configuration

FIG. 1A shows the VDD-VDDQ potential difference detecting circuit to perform the slew rate controlling method for output data according to the first embodiment. FIG. 1B shows the slew rate controlling circuit to perform the slew rate controlling method for output data according to the first embodiment.

The VDD-VDDQ potential difference detecting circuit 1, as shown in FIG. 1A, chiefly includes differential amplifiers 11 and 12, and latch circuits 13 and 14. The differential amplifier 11, when a potential difference between the power supply VDD to be used internally and the power supply VDDQ to be used for outputting becomes a set value or less, produces a low-level output and the latch circuit 13 latches an output from the differential amplifier 11 in response to a timing pulse WT and outputs a low-level signal SLP. The differential amplifier 12, when a potential difference between the power supply VDD to be used internally and the power supply VDDQ to be used for outputting becomes a set value or more, produces a high-level output and the latch circuit 14 latches an output from the differential amplifier 12 in response to a timing pulse WT and outputs a high-level signal SLN.

The slew rate controlling circuit 2, as shown in FIG. 1B, chiefly includes a driver circuit 3 and an output buffer circuit 4. The driver circuit 3 has a first driver circuit 36 adapted to receive data DATAPj and to produce an output signal DOPj_B through an inverter 31, a PMOS (P-channel Metal Oxide Semiconductor) transistor 32, and an NMOS (N-channel MOS) transistor 33 and to perform speed (timing) calibration on the output signal DOPj_B by changing a ratio between a driving capability of a PMOS transistor 34 using a signal SLP and a driving capability of an NMOS transistor 35 using a signal SLN, and a second driver circuit 312 adapted to receive data DATANj and to produce an output signal DONj_B through an inverter 37, a PMOS transistor 38, and an NMOS transistor 39 and to perform speed (timing) calibration on the output signal DONj_B by changing a ratio between a driving capability of a PMOS transistor 310 using a signal SLP and a driving capability of an NMOS transistor 311 using a signal SLN. Moreover, the output buffer circuit 4 has a PMOS transistor 41 adapted to receive the output signal DOPj_B through its gate and to generate an output at an external terminal DQj and a NMOS transistor 42 adapted to receive the output signal DONj_B through its gate and to generate the output at the external terminal DQj.

Next, operations of the slew rate controlling method for output data as shown in FIG. 1 will be described by referring to FIG. 2. In FIG. 2, slew rate controlling operations for output data to be performed in the case of an SDR (Single Data Rate) SDRAM having a power supply system of VDD=2.5 V and VDDQ=1.8 V are described. The driver circuit 3 and the output buffer circuit 4 as respectively shown in FIG. 1 operate as three-state buffers and, if the signals SLP and SLN are not considered and when input data DATAPj="H" (high) and DATANj="H", the PMOS transistor 41 in the output buffer circuit 4 is turned ON and the NMOS transistor 42 is turned OFF and an output from the external terminal DQj is driven to become high. Likewise, when input data DATAPj="L" (low) and DATANj="L", the PMOS transistor 41 in the output buffer circuit 4 is turned OFF and the NMOS transistor 42 is turned ON and an output from the external terminal DQj is driven to become low and, when input data DATAPj="L" (low) and DATANj="H", an output from the external terminal DQj becomes high in level.

In a first half (left side) of the timing diagram shown in FIG. 2, operations to be performed when a potential difference between the power supplies VDD and VDDQ becomes small due to intrinsic or extrinsic factor are shown. In the example shown in FIG. 2, the potential difference is 0.5 V or less (2.35 V–1.85 V). For example, when a WRITE command is input, results from comparison of a potential difference between the power supplies VDD and VDDQ in the VDD–VDDQ potential difference detecting circuit 1 are sampled and, as a result, a signal SLP becomes low in level and a signal SLN also becomes low in level.

As a result, when an outputting operation is next performed by inputting of a READ command, outputs DOPj_B and DONj_B change to be at a high level in the first driver circuit section 36 and the second driver circuit section 312, and a correction is made to enlarge an "L" slew rate (tF) of the output from the external terminal DQj.

Also, in a second half (right side) of the timing diagram shown in FIG. 2, operations to be performed when a potential difference between the power supplies VDD and VDDQ becomes large due to intrinsic or extrinsic factor are shown. In the example shown in FIG. 2, the potential difference is 1.0 V or more (2.8 V–1.8 V). For example, when a WRITE command is input, results from comparison of a potential difference between the power supplies VDD and VDDQ in the VDD–VDDQ potential difference detecting circuit 1 are sampled and, as a result, the signal SLP becomes high in level and the signal SLN also becomes high in level. Because of this, when an outputting operation is next performed according to inputting of a READ command, in the first driver circuit section 36 and the second driver circuit section 312, the output DOPj_B and DONj_B are changed to be at a low level and a correction is made to enlarge an "H" slew rate (tR) of the output from the external terminal DQj.

Thus, unlike in the case of the conventional technology in which an output is out of balance between its high and low levels due to worsening of either of the slew rate tR or the slew rate tF caused by change in a potential difference between the power supplies VDD and VDDQ during operations, according to the embodiment, since the slew rate controlling method is carried out in a manner so as to correct the worsening of the slew rate, it is made possible to improve an output window.

Concrete Configuration

The VDD–VDDQ potential difference detecting circuit 1 of the embodiment, as shown in FIG. 3, includes a differential amplifier A section 5, a differential amplifier B section 6, and a sampling circuit section 7. The differential amplifier A section 5 is made up of a differential amplifier adapted to detect a potential difference in a divided voltage ratio setting section AR1 for the power supply VDD to be used internally and in a divided voltage ratio setting section AR2 for the power supply VDDQ to be used for outputting, which is optimized so as to control speed (tF) at time of a voltage drop occurring when an output data is at an "L" level in particular and has a MOS capacitor AM1 forming a filter to remove noise in an output of the divided voltage ratio setting section AR1 and to compensate for an output level and a MOS capacitor AM2 forming a filter to remove noise in an output of the divided voltage ratio setting section AR2 and to compensate for an output level.

The differential amplifier B section 6 is made up of a differential amplifier adapted to detect a potential difference in a divided voltage ratio setting section BR1 for the power supply VDD to be used internally and in a divided voltage ratio setting section BR2 for the power supply VDDQ to be used for outputting, which is optimized so as to control speed (tR) at time of a voltage rise occurring when an output data is at a "H" level in particular and has a MOS capacitor BM1 forming a filter to remove noise in an output of the divided voltage ratio setting section BR1 and to compensate for an output level and a MOS capacitor BM2 forming a filter to remove noise in an output of the divided voltage ratio setting section BR2 and to compensate for an output level.

The sampling circuit section 7, in the embodiment, is adapted to sample a potential difference when an SDRAM receives a WRITE command and has a latch circuit AL to latch an output from the differential amplifier A section 5 in response to a pulse signal WT being issued internally, when the WRITE command is issued and a latch circuit BL to latch an output from the differential amplifier B section 6 in response to a pulse signal WT being issued internally, when the WRITE command is issued.

In FIG. 3, a signal EN_B is an enable signal used to put the VDD–VDDQ potential difference detecting circuit 1 of this embodiment into an operating state and a signal RST is a reset signal used to reset latch data of the latch circuit AL and latch circuit BL.

A slew rate controlling circuit 8 of this embodiment, as shown in FIG. 4, includes a NAND/NOR circuit section 81, a selector circuit section 82, a driver circuit 83, and an output buffer circuit 84.

In the slew rate controlling circuit 8, the NAND/NOR circuit section 81 is made up of a NAND circuit 811 and NOR circuit 813 to receive a data signal DatajR read from a memory and output at time of a rise of an external clock to exert control on output data from for example a DDR SDRAM (SDRAM operating at a double data rate) and an output buffer enable signal DOCR (low-impedance/high-impedance controlling signal) through their gates and a NAND circuit 812 and NOR circuit 814 to receive a data signal DatajF to be output at time of a fall of an external clock and an output buffer enable signal DOCF (low-impedance/high-impedance controlling signal) through their gates.

The selector circuit section 82 includes gate circuits 821 and 822 to select one of outputs from the NAND circuits 811 and 812 in response to complementary clock signals QCLK and QCLK_B and to output an output data DATAPj through an inverter 825 and gate circuits 823 and 824 to select one of outputs from the NOR circuits 813 and 814 in response to complementary clock signals QCLK and QCLK_B and to output an output data DATANj through an inverter 826.

The driver circuit 83 has configurations being equivalent to those of the driver circuit section 3 shown in FIG. 1 and includes a first driver circuit section 836 to receive the data DATAPj and to produce an output signal DOPj_B through an inverter 831, a PMOS transistor 832, an NMOS transistor 833 and to perform speed (timing) calibration on the output signal DOPj_B by changing a ratio of driving capability of the PMOS transistor 834 using a signal SLP and of the NMOS transistor 835 using a signal SLN and a second driver circuit section 8312 to receive the data DATANj and to produce an output signal DONj_B through an inverter 837, a PMOS transistor 838, an NMOS transistor 839 and to perform speed (timing) calibration on the output signal DONj_B by changing a ratio of driving capability of a PMOS transistor 8310 using a signal SLP and of a NMOS transistor 8311 using a signal SLN.

As a result, after data to be output at time of a rise or fall of an external clock has been selected by complementary clock signals QCLK and QCLK_B in the selector circuit section 82, signals DOPj_B and DONj_B are output by the driver circuit 83 whose driving capability has been properly calibrated, in response to signals SLP and SLN fed from the VDD–VDDQ potential difference detecting circuit 1 shown in FIG. 3.

The output buffer circuit 84 has configurations being equivalent to those of the output buffer circuit 4 shown in FIG. 1 and includes a PMOS transistor 841 and an NMOS transistor 842 to respectively receive signals DOPj_B and DONj_B on which speed calibration has been performed by the driver circuit 83 through their gates and to have an output be generated at an external terminal DQj.

Operations of the slew rate controlling circuit 8 shown in FIG. 4 are described below. In the NAND/NOR circuit section 81 shown in FIG. 4, the NAND circuit 811 operates to NAND (AND and invert) a data signal DatajR to be output at time of a rise of an external clock and an output buffer enable signal DOCR to be used then and to propagate and output the data signal DatajR to be output at time of a rise of an external clock when the output buffer is in an enable state and, when the output buffer is in a disenable state, to generate a high-level output so that the output data DOPj_B becomes high in level. Also, the NAND circuit 812 operates to NAND a data signal DatajF to be output at time of a fall of an external clock and an output buffer enable signal DOCF to be used then and to propagate and output the data signal DatajF to be output at time of a fall of an external clock when the output buffer is in an enable state and, when the output buffer is in a disenable state, to generate a high-level output so that the output data DOPj_B becomes high in level.

The NOR circuit 813 operates to NOR a data signal DatajR to be output at time of a rise of an external clock and an output buffer enable signal DOCR to be used then and to propagate and output the data signal DatajR to be output at time of a rise of an external clock when the output buffer is in an enable state and, when the output buffer is in a disenable state, to generate a low-level output so that the output data DONj_B becomes low in level. The NOR circuit 814 operates to NOR a data signal DatajF to be output at time of a fall of an external clock and an output buffer enable signal DOCF to be used then and to propagate and output the data signal DatajF to be output at time of a fall of an external clock when the output buffer is in an enable state and, when the output buffer is in a disenable state, to generate a low-level output so that the output data DONj_B becomes low in level.

The selector circuit section 82 selects either of an output from the NAND circuit 811 or an output from the NAND circuit 812 by three-state gates 821 and 822 in response to outputting complementary clocks QCLK and QCLK_B, inverts it using the inverter 825 and produces output data DATAPj, and also selects either of an output from the NOR circuit 813 and an output from the NOR circuit 814 by three-state gates 823 and 824 in response to outputting complementary clocks QCLK and QCLK_B, inverts it using the inverter 826 and then produces output data DATANj. Operations of the driver circuit 83 and the output buffer circuit 84 are the same as those in the first embodiment shown in FIG. 1.

Next, operations to perform the slew rate controlling method for output data shown in FIGS. 3 and 4 are described by referring to FIG. 5. In FIG. 5, slew rate controlling operations of output data performed in the case of a DDR SDRAM of a power supply system of VDD=2.5 V and VDDQ=1.8 V are described.

In a first half (left side) of the timing diagram shown in FIG. 5, when a potential difference between the power supplies VDD and VDDQ becomes small due to intrinsic or extrinsic factor, (in the example shown in FIG. 5, the potential difference is 0.5 V or less (2.35V–1.85 V), at time of inputting of a WRITE command, results from comparison of a potential difference between the power supplies VDD and VDDQ in the VDD–VDDQ potential difference detecting circuit 1 are sampled and, as a result, a signal SLP becomes low in level and a signal SLN becomes low in level.

Next, by inputting of a READ command, with an output buffer enable signal DOCR being output, data DatajR is output when a clock QCLK rises. Also, with an output buffer enable signal DOCF being output, data DatajF is output at time of a rise of clock QCLK_B. As a result, in the driver circuit 83, control to change a ratio of driving capability of the PMOS and NMOS transistors in response to signals SLP and SLN is exerted on data DATAPj and DATANj output through the selector circuit section 82, data DOPj_B and DONj_B are output and a correction is made to enlarge an "L" slew rate (tF) of output data DQj.

Moreover, in a second half (left side) of the timing diagram shown in FIG. 5, when a potential difference between the power supplies VDD and VDDQ becomes large due to intrinsic or extrinsic factor, (in the example shown in FIG. 5, the potential difference is 1.0 V or more (2.8 V–1.8 V), at time of inputting of a WRITE command, results from comparison of a potential difference between the power supplies VDD and VDDQ in the VDD–VDDQ potential difference detecting circuit 1 are sampled and, as a result, a signal SLP becomes high in level and a signal SLN becomes high in level. Next, by inputting of a READ command, with an output buffer enable signal DOCR being output, data DatajR is output when a clock QCLK rises. Also, with an output buffer enable signal DOCF being output, data DatajF is output at time of a rise of clock QCLK_B. As a result, in the driver circuit 83, control to change a ratio of driving capability of the PMOS and NMOS transistors in response to signals SLP and SLN is exerted on data DATAPj and DATANj output through the selector circuit section 82, data DOPj_B and DONj_B are output and a correction is made to enlarge a "H" slew rate (tR) of output data DQj.

Thus, unlike in the case of the conventional technology in which an output is out of balance between its high and low levels due to worsening of either of the slew rate tR or the slew rate tF caused by change in a potential difference between the power supplies VDD and VDDQ during operations, according to the embodiment, since the slew rate controlling method is carried out in a manner so as to correct the worsening of the slew rate, it is made possible to improve an output window.

Hereinafter, examples of concrete effects of the slew rate controlling method for output data shown in the embodiment are described by referring to FIGS. 6 and 7. FIGS. 6 and 7 show results from simulation of improvements in VDDQ to tDQSQ (DQS to DQ skew, where DQS=Data Strove, DQ=Data Output) in the case of a DDR SDRAM of a power supply system of VDD=2.5 V and VDDQ=1.8 V. FIG. 6 is an example obtained when the VDD is minimum (2.35 V) and FIG. 7 is an example obtained when the VDD is maximum (2.8 V). Moreover, the "tDQSQ" value is an AC characteristic value used to show a degree of improvements in an output data window and is designated in specs (JESD79R1 and JESD79R2) of a DDR SDRAM which have been standardized by the JEDEC (Joint Electron Device Engineering Council). When an absolute value of the tDQSQ is smaller, the more excellent data window can be obtained.

As shown in FIG. 6, in a state where the VDDQ is at a slew rate switching level (about 1.85 V in the graph shown in FIG. 6), ON/OFF switching of a signal SLP is done. "SLP ON" shown in FIG. 6 represents that the signal SLP is at an "L" level and "SLP OFF" represents that the signal SLP is at a "H" level. Under conditions of the potential difference between the power supplies VDD and VDDQ shown in the graph of FIG. 6, the "SLP OFF" state occurs all the time. In the graph shown in FIG. 6, for comparison, changes in the "tDQSQ" that occur when the slew rate control according to the present invention is not exerted and when the "SLP OFF" state or the "SLP ON" state is maintained, irrespective of the VDDQ, under conditions that each of MOS junctions of SDRAM devices is at a high temperature (110° C.) and a low temperature (–5° C.), are expressed by fine solid lines.

In the graph shown in FIG. 6, a bold line shows change in the "tDQSQ" value occurring when the slew rate control is exerted according to the embodiment, where, at the slew rate switching level, under each condition of the high temperature (bold dashed line) and the low temperature (bold solid line), a migration of dependence of the "tDQSQ" value on the VDDQ occurs so that the dependence on the VDDQ is reduced.

As is apparent from FIG. 6, when the tDQSQ is maximum and minimum, an absolute value of the tDQSQ becomes smaller when change in a potential of the VDDQ occurs and, as a result, a worst value of the tDQSQ is improved.

FIG. 7 shows that, when the VDDQ is at a slew rate switching level (in the graph in FIG. 7, about 1.8 V), switching between ON and OFF of the signal SLN occurs. In FIG. 7, the "SLN ON" represents that the signal SLN is at a high level and the "SLN OFF" represents that the signal SLN is at a low level. Under conditions of the potential difference between the power supplies VDD and VDDQ shown in FIG. 7, the "SLP OFF" state occurs all the time.

In the graph shown in FIG. 7, as in the case of the graph in FIG. 6, for comparison, changes in the "tDQSQ" value that occurs when the slew rate control according to the present invention is not exerted and when the "SLP OFF" state or the "SLP ON" state is maintained, irrespective of the VDDQ, under conditions that each of MOS junctions of SDRAM devices is at a high temperature (110° C.) and a low temperature (–5° C.), are expressed by fine solid lines.

In the graph shown in FIG. 7, a bold line shows change in the "tDQSQ" value occurring when the slew rate control is exerted according to the present invention where a migration of dependence of the "tDQSQ" value on the VDDQ occurs, at a point of the slew rate switching level and under both conditions of high temperatures (expressed by bold broken lines) and low temperatures (expressed by bold solid lines), so that the dependence on the VDDQ is reduced. As is apparent from FIG. 7, when the tDQSQ is maximum and minimum, an absolute value of the tDQSQ becomes smaller when change in a potential of the VDDQ occurs and, as a result, a worst value of the tDQSQ is improved.

Thus, as is apparent from the simulation results shown in FIGS. 6 and 7, when a correction is made according to the slew rate controlling method for output data of the embodiment, the dependence of the tDQSQ value on a potential difference between the power supplies VDD and VDDQ becomes small and, as a result, an effect can be obtained that a worst value of the tDQSQ is improved and an output data window is improved.

Second Embodiment

Basic configurations employed in a second embodiment are the same as those in the first embodiment. However, a slew rate controlling method differs from that in the first embodiment in that timing with which results from comparison of a potential difference between power supplies VDD and VDDQ in a VDD–VDDQ potential difference detecting circuit are sampled is different.

That is, in the first embodiment, the results from comparison of a potential difference between the power supplies VDD and VDDQ are sampled when a WRITE command is received. However, timing of the sampling is not limited to this case. In the second embodiment, results from comparison of a potential difference are sampled when any one of an MRS (Mode Register Set) command being a set command for a register to set an operating mode of an SDRAM, an EMRS (Extended Mode Register Set) command being a set command for an extended register to set an operating mode of the SDRAM, an ACTIVE command being a command to provide an instruction for activating row systems in the SDRAM, a READ command to provide an instruction for reading from the SDRAM is received. Moreover, the MRS command and EMRS command are stated in a data sheet of the JEDEC described above.

Moreover, in the second embodiment, information about timing of the sampling to be initiated by inputting of which command is stored in an another register depending on whether the command is of the MRS type or the EMRS type and then, according to the timing having been set in the register, results from comparison of a potential difference between the power supplies VDD and VDDQ are sampled.

It is apparent that the present invention is not limited to the above embodiments but may be changed and modified without departing from the scope and spirit of the invention. For example, in the above first embodiment, the VDD–VDDQ potential difference detecting circuit has two kinds of differential circuit sections (differential amplifier A section and differential amplifier B section) to produce two kinds of slew rate controlling signals made up of the signal SLP for calibration of the slew rate "tF" and of the signal SLN for calibration of the slew rate "tR" and the slew rate control is achieved according to the signals SLP and SLN. However, the present invention is not limited to this. The VDD–VDDQ potential difference detecting circuit may have N (N>2) kinds of differential amplifiers and further finer slew rate calibration can be achieved by performing the calibration on the slew rates tF and tR in divided steps, for example, N steps. Moreover, the slew rate controlling method of the present invention may be applied not only to an output buffer for a memory of an SDRAM or a like but also to an output buffer for an IC (Integrated Circuit) driver or like.

What is claimed is:

1. A slew rate controlling system for output data, said system comprising:
   a potential difference detecting means to detect a decrease in a potential difference between a first power supply and a second power supply to produce a first signal with specified timing, and to detect an increase in the potential difference between said first power supply and said second power supply to produce a second signal with the specified timing; and
   a slew rate controlling means to exert, when said first signal is significant, control so as to enlarge a transition speed occurring at time of a fall of output data, and, when said second signal is significant, control so as to enlarge a transition speed occurring at time of a rise of output data, to produce output data,
   wherein said potential difference detecting means comprises a first signaling means to produce said first signal with said specified timing when the potential difference between said first power supply and said second power supply becomes a preset value or less, and a second signaling means to produce said second signal with the specified timing when the potential difference between said first power supply and said second power supply becomes said preset value or more.

2. The slew rate controlling system for output data according to claim 1, wherein:
   said first signaling means comprises a first differential amplification means to produce an output when the potential difference between said first power supply and said second power supply becomes said preset value or less, and a first sampling means to latch an output from said first differential amplification means with the specified timing and to produce said first signal; and
   said second signaling means comprises a second differential amplification means to produce an output when the potential difference between said first power supply and said second power supply becomes said preset value or more, and a second sampling means to latch an output from said second differential amplification means and to produce said second signal.

3. The slew rate controlling system for output data according to claim 1, wherein, in said potential difference detecting means, the specified timing with which said first or second signal is produced is timing with which an external command is received.

4. The slew rate controlling system for output data according to claim 3, wherein said external command comprises at least one of a writing command or a reading command in a memory device, an active command to provide an instruction for initiating operations of row systems, a mode register set command to provide an instruction for setting of an operating mode set register, and an extended mode register set command to provide an instruction for setting of an extended operating mode set register.

5. The slew rate controlling system according to claim 1, wherein, in said potential difference detecting means, the specified timing with which said first or second signal is produced is timing that is set at another register when a mode register set command, to provide an instruction for setting of an operating mode set register, or an extended mode register set command, to provide an instruction for setting of an extended operating mode set register, is received.

6. The slew rate controlling system according to claim 1, wherein said slew rate controlling means comprises a driver means to exert, when said first signal is significant, control on said first and second input data so as to enlarge a transition speed occurring at said time of said fall of output data and, when said second signal is significant, so as to enlarge a transition speed occurring at said time of said rise of output data, and to produce first and second output data; and an output buffer means to produce a high-level output when both said first and second output data are at a low level, and to produce a low-level output when both said first and second output data are at a high level.

7. The slew rate controlling system according to claim 6, wherein said slew rate controlling means comprises:
   a logically-operated means having a first logical device to propagate and output a data signal to be output at said time of said rise of an external clock when said output buffer is in an enable state, and, when said output buffer is in a disenable state, to output a high level all the time;
   a second logical device to propagate and output a data signal to be output at said time of said fall of said external clock when said output buffer is in said enable state, and, when said output buffer is in said disenable state, to output said high level all the time;
   a third logical device to propagate and output said data signal to be output at said time of said rise of said external clock when said output buffer is in said enable state, and, when said output buffer is in said disenable state, to output a low level all the time;
   a fourth logical device to propagate and output said data signal to be output at said time of said fall of said external clock when said output buffer is in said enable state, and, when said output buffer is in said disenable state, to output said low level all the time; and
   a selector means to select an output from among said output from said first logical device and said output from said second logical device in response to a complementary clock signal to be used for outputting and to produce said first output data, and to select an output from among said output from said third logical device and said output from said fourth logical device in response to said complementary clock signal to be used for outputting and to produce said second output data.

8. A slew rate controlling system for output data, said system comprising:
a potential difference detecting means to detect a decrease in a potential difference between a first power supply and a second power supply, to produce a first signal with specified timing, and to detect an increase in the potential difference between said first power supply and said second power supply, to produce a second signal with the specified timing; and
a slew rate controlling means to exert, when said first signal is significant, control so as to enlarge a transition speed occurring at a time of a fall of output data, and, when said second signal is significant, control so as to enlarge a transition speed occurring at a time of a rise of output data, to produce output data,
wherein said slew rate controlling means comprises a driver means to exert, when said first signal is significant, control so as to enlarge a transition speed occurring at said time of said fall of output data and, when said second signal is significant, so as to enlarge said transition speed occurring at said time of said rise of output data, and to produce first and second output data; and an output buffer means to produce a high-level output when both said first and second output data are at a low level, and to produce a low-level output when both said first and second output data are at a high level.

9. The slew rate controlling system according to claim 8, wherein said slew rate controlling means comprises:
a logically-operated means having a first logical device to propagate and output a data signal to be output at said time of said rise of an external clock when said output buffer is in an enable state, and, when said output buffer is in a disenable state, to output a high level all the time;
a second logical device to propagate and output said data signal to be output at said time of said fall of said external clock when said output buffer is in said enable state, and, when said output buffer is in said disenable state, to output said high level all the time;
a third logical device to propagate and output said data signal to be output at said time of said rise of said external clock when said output buffer is in said enable state, and, when said output buffer is in said disenable state, to output a low level all the time;
a fourth logical device to propagate and output said data signal to be output at said time of said fall of said external clock when said output buffer is in said enable state, and, when said output buffer is in said disenable state, to output said low level all the time; and
a selector means to select an output from among said output from said first logical device and said output from said second logical device in response to a complementary clock signal to be used for outputting and to produce said first output data, and to select an output from among said output from said third logical device and said output from said fourth logical device in response to said complementary clock signal to be used for outputting and to produce said second output data.

10. A slew rate controlling system for output data, said system comprising:
a potential difference detecting circuit to detect a decrease in a potential difference between a first power supply and a second power supply to produce a first signal with specified timing, and to detect an increase in the potential difference between said first power supply and said second power supply to produce a second signal with the specified timing; and
a slew rate controlling circuit to exert, when said first signal is significant, control so as to enlarge a transition speed occurring at time of a fall of output data, and, when said second signal is significant, control so as to enlarge a transition speed occurring at time of a rise of output data, to produce output data,
wherein said potential difference detecting circuit comprises a first signaling circuit to produce said first signal with said specified timing when the potential difference between said first power supply and said second power supply becomes a preset value or less, and a second signaling circuit to produce said second signal with the specified timing when the potential difference between said first power supply and said second power supply becomes said preset value or more.

11. The slew rate controlling system for output data according to claim 10, wherein:
said first signaling circuit comprises a first differential amplification circuit to produce an output when the potential difference between said first power supply and said second power supply becomes said preset value or less, and a first sampling circuit to latch an output from said first differential amplification circuit with the specified timing and to produce said first signal; and
said second signaling circuit comprises a second differential amplification circuit to produce an output when the potential difference between said first power supply and said second power supply becomes said preset value or more, and a second sampling circuit to latch an output from said second differential amplification circuit and to produce said second signal.

12. The slew rate controlling system for output data according to claim 10, wherein, in said potential difference detecting circuit, the specified timing with which said first or second signal is produced is timing with which an external command is received.

13. The slew rate controlling system for output data according to claim 12, wherein said external command comprises at least one of a writing command or a reading command in a memory device, an active command to provide an instruction for initiating operations of row systems, a mode register set command to provide an instruction for setting of an operating mode set register, and an extended mode resister set command to provide an instruction for setting of an extended operating mode set register.

14. The slew rate controlling system according to claim 10, wherein, in said potential difference detecting circuit, the specified timing with which said first or second signal is produced is timing that is set at another register when mode register set command, to provide an instruction for setting of an operating mode set register, or an extended mode register set command, to provide an instruction for setting of an extended operating mode set register, is received.

15. The slew rate controlling system according to claim 10, wherein said slew rate controlling circuit comprises a driver circuit to exert, when said first signal is significant, control on said first and second input data so as to enlarge a transition speed occurring at said time of said fall of output data and, when said second signal is significant, so as to enlarge a transition speed occurring at said time of said rise of output data, and to produce first and second output data; and an output buffer circuit to produce a high-level output when both said first and second output data are at a low level, and to produce a low-level output when both said first and second output data are at a high level.

16. The slew rate controlling system according to claim 15, wherein said slew rate controlling circuit comprises:
- a logically-operated circuit having a first logical device to propagate and output a data signal to be output at said time of said rise of an external clock when said output buffer is in an enable state, and, when said output buffer is in a disenable state, to output a high level all the time;
- a second logical device to propagate and output a data signal to be output at said time of said fall of said external clock when said output buffer is in said enable state, and, when said output buffer is in said disenable state, to output said high level all the time;
- a third logical device to propagate and output said data signal to be output at said time of said rise of said external clock when said output buffer is in said enable state, and, when said output buffer is in said disenable state, to output a low level all the time;
- a fourth logical device to propagate and output said data signal to be output at said time of said fall of said external clock when said output buffer is in said enable state, and, when said output buffer is in said disenable state, to output said low level all the time; and
- a selector circuit to select an output from among said output from said first logical device and said output from said second logical device in response to a complementary clock signal to be used for outputting and to produce said first output data, and to select an output from among said output from said third logical device and said output from said fourth logical device in response to said complementary clock signal to be used for outputting and to produce said second output data.

17. A slew rate controlling system for output data, said system comprising:
- a potential difference detecting circuit to detect a decrease in a potential difference between a first power supply and a second power supply to produce a first signal with specified timing, and to detect an increase in the potential difference between said first power supply and said second power supply to produce a second signal with the specified timing; and
- a slew rate controlling circuit to exert, when said first signal is significant, control so as to enlarge a transition speed occurring at a time of a fall of output data, and, when said second signal is significant, control so as to enlarge a transition speed occurring at time of a rise of output data, to produce output data,
- wherein said slew rate controlling circuit comprises a driver circuit to exert, when said first signal is significant, control so as to enlarge a transition speed occurring at said time of said fall of output data and, when said second signal is significant, so as to enlarge said transition speed occurring at said time of said rise of output data, and to produce first and second output data; and an output buffer circuit to produce a high-level output when both said first and second output data are at a low level, and to produce a low-level output when both said first and second output data are at a high level.

18. The slew rate controlling system according to claim 17, wherein said slew rate controlling circuit comprises:
- a logically-operated circuit having a first logical device to propagate and output a data signal to be output at said time of said rise of an external clock when said output buffer is in an enable state, and, when said output buffer is in a disenable state, to output a high level all the time;
- a second logical device to propagate and output a data signal to be output at said time of said fall of said external clock when said output buffer is in said enable state, and, when said output buffer is in said disenable state, to output said high level all the time;
- a third logical device to propagate and output said data signal to be output at said time of said rise of said external clock when said output buffer is in said enable state, and, when said output buffer is in said disenable state, to output a low level all the time;
- a fourth logical device to propagate and output said data signal to be output at said time of said fall of said external clock when said output buffer is in said enable state, and, when said output buffer is in said disenable state, to output said low level all the time; and
- a selector circuit to select an output from among said output from said first logical device and said output from said second logical device in response to a complementary clock signal to be used for outputting and to produce said first output data, and to select an output from among said output from said third logical device and said output from said fourth logical device in response to said complementary clock signal to be used for outputting and to produce said second output data.

19. A slew rate controlling method for output data, said system comprising:
- detecting a decrease in a potential difference between a first power supply and a second power supply to produce a first signal with specified timing when the potential difference between said first power supply and said second power supply becomes a preset value or less;
- detecting an increase in the potential difference between said first power supply and said second power supply to produce a second signal with the specified timing when the potential difference between said first power supply and said second power supply becomes said preset value or more;
- when said first signal is significant, exerting control so as to enlarge a transition speed occurring at time of a fall of output data, to produce output data; and
- when said second signal is significant, exerting control so as to enlarge a transition speed occurring at time of a rise of output data, to produce output data.

* * * * *